(12) United States Patent
Chujo et al.

(10) Patent No.: US 8,358,172 B2
(45) Date of Patent: Jan. 22, 2013

(54) PEAKING CIRCUIT, METHOD FOR ADJUSTING PEAKING CIRCUIT, DIFFERENTIAL AMPLIFIER INSTALLING PEAKING CIRCUIT, LASER DIODE DRIVING CIRCUIT INSTALLING PEAKING CIRCUIT, AND DATA PROCESSING UNIT INSTALLING PEAKING CIRCUIT

(75) Inventors: Norio Chujo, Tokyo (JP); Tsuneo Kawamata, Oume (JP); Toshiaki Takai, Yokohama (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 13/023,912

(22) Filed: Feb. 9, 2011

(65) Prior Publication Data
US 2011/0241778 A1    Oct. 6, 2011

(30) Foreign Application Priority Data
Apr. 2, 2010   (JP) .................................. 2010-086024

(51) Int. Cl.
*H03F 3/45*   (2006.01)
*H03F 3/191*  (2006.01)

(52) U.S. Cl. ........................................ 330/254; 330/305

(58) Field of Classification Search .................. 330/252, 330/253, 305, 254
See application file for complete search history.

(56) References Cited

U.S. PATENT DOCUMENTS

| 7,193,463 | B2 | 3/2007 | Miyashita et al. |
| 7,286,013 | B2 * | 10/2007 | Vice .............................. 330/253 |
| 7,786,785 | B2 | 8/2010 | Kanda et al. |
| 2005/0088233 | A1 | 4/2005 | Miyashita et al. |
| 2009/0066394 | A1 | 3/2009 | Kanda et al. |

FOREIGN PATENT DOCUMENTS

| JP | 09-064920 | 3/1997 |
| JP | 11-040855 | 2/1999 |
| JP | 2005-136453 | 5/2005 |
| WO | WO2007/110915 | 10/2007 |

* cited by examiner

*Primary Examiner* — Steven J Mottola
(74) *Attorney, Agent, or Firm* — Antonelli, Terry, Stout & Kraus, LLP

(57) ABSTRACT

A peaking circuit for adjusting peaking of a high-frequency signal, comprises: a first inductor; a second inductor which is electromagnetically coupled with the first inductor; a signal input section which receives an input signal; a transistor which adjusts electric current passing through the second inductor according to the input signal inputted via the signal input section; and a signal output section which outputs a signal whose peaking has been adjusted by the first inductor. Mutual inductance of the electromagnetically coupled first and second inductors is changed by the adjustment of the electric current passing through the second inductor, according to the input signal inputted via the signal input section, with the use of the transistor, thereby adjusting the peaking of signal waveform of electric current passing through the first inductor, and the signal subjected to the peaking adjustment is outputted from the signal output section.

14 Claims, 8 Drawing Sheets

PEAKING CIRCUIT, METHOD FOR ADJUSTING PEAKING CIRCUIT, DIFFERENTIAL AMPLIFIER INSTALLING PEAKING CIRCUIT, LASER DIODE DRIVING CIRCUIT INSTALLING PEAKING CIRCUIT, AND DATA PROCESSING UNIT INSTALLING PEAKING CIRCUIT

BACKGROUND

The present invention relates to a peaking circuit and a peaking adjustment method for controlling the occurrence of the peaking in a driver circuit (driver circuit for printed circuit board signal transmission, LD (Laser Diode) driver circuit, etc.) having a high transmission rate (e.g., over 1 Gbps (gigabit per second)) or in a device (information-processing apparatus (server, router, etc.), measurement apparatus, optical module, etc.) employing such driver circuits. The present invention relates also to a differential amplifier, a laser diode driving circuit and a data-processing unit which are equipped with a peaking circuit.

Information-processing apparatus (servers, routers, etc.) and measurement apparatus of today are required to process more and more data per unit time. In such situation, research and development are being conducted actively to speed up the signal transmission between circuits on an LSI of a device, the signal transmission between LSIs or printed circuit boards of a device, and optical modules used for networks (LAN, WAN, etc.) connecting such devices.

However, the above speeding up is usually accompanied by distortion of signal waveforms (due to wiring capacitance of LSIs, capacitance at the pads of LSIs, laser diodes, LSI packages, etc. and signal loss occurring in printed circuit boards and signal transmission lines such as cables), which leads to data errors.

A technique for compensating for the signal waveform distortion has been disclosed in Japanese Patent Laid-Open Publication No. 2005-136453, for example.

In Japanese Patent Laid-Open Publication No. HEI9-64920, a waveform shaping circuit for shaping the signal waveform of a pulse signal sequence is equipped with a gain-frequency characteristic circuit section which has its peaking property in a high-frequency part of the required frequency range. With the gain-frequency characteristic circuit section, the waveform shaping circuit performs the waveform shaping so that the amplitude of fast signal components becomes larger than that of slow signal components of the input.

A peaking control circuit disclosed in WO2007/110915 is equipped with a peaking detection unit for detecting the amount of the peaking (hereinafter referred to as "peaking level") of an output section of an inductor peaking circuit and a control signal generating unit for varying the circuit parameters of the inductor peaking circuit based on the peaking level detected by the peaking detection unit.

A diode driver circuit described in Japanese Patent Laid-Open Publication No. HEI11-40855 is provided with a peaking current generating circuit.

However, the aforementioned technique of Japanese Patent Laid-Open Publication No. 2005-136453 is hardly usable for adjusting the peaking after the assembly into a package since the technique employs bonding wires.

Further, even though high-speed transmission circuits over 10 Gbps (gigabits per second) require compensation for the deterioration in the frequency characteristics caused by wiring impedance, parasitic capacitance occurs in transistor circuits like those described in Japanese Patent Laid-Open Publication No. HEI9-64920 and WO2007/110915. The parasitic capacitance, which is practically negligible in a relatively low-frequency range (below 1 Gbps), becomes nonnegligible in a high-frequency range over 10 Gbps. This makes the compensation for the frequency characteristics deterioration more and more difficult.

Moreover, peaking adjustment employing the circuitry described in Japanese Patent Laid-Open Publication No. HEI11-40855 results in a considerable increase in power consumption.

SUMMARY

It is therefore the primary object of the present invention to provide a peaking adjustment circuit capable of preventing the deterioration in the frequency characteristics of a high-frequency circuit (circuit handling high-frequency signals) in the high-frequency range with less power consumption.

In accordance with an aspect of the present invention, a peaking circuit for adjusting peaking of a high-frequency signal comprises: a first inductor; a second inductor which is electromagnetically coupled with the first inductor; a signal input section which receives an input signal; a transistor which adjusts electric current passing through the second inductor according to the input signal inputted via the signal input section; and a signal output section which outputs a signal whose peaking has been adjusted by the first inductor, wherein: mutual inductance of the electromagnetically coupled first and second inductors is changed by the adjustment of the electric current passing through the second inductor, according to the input signal inputted via the signal input section, with the use of the transistor, thereby adjusting the peaking of signal waveform of electric current passing through the first inductor, and the signal subjected to the peaking adjustment is outputted from the signal output section.

In accordance with another aspect of the present invention, a differential amplifier comprises: a first inductor pair formed by first and second inductors placed to be electromagnetically coupled with each other; a second inductor pair formed by third and fourth inductors placed to be electromagnetically coupled with each other; a first differential pair formed by first and second transistors whose sources are connected to each other; a second differential pair formed by third and fourth transistors whose sources are connected to each other; a high-frequency signal input section which inputs a high-frequency signal to the first differential pair and the second differential pair; a high-frequency signal output section which outputs high-frequency signals from the first inductor pair and the second inductor pair, respectively; and a peaking adjustment circuit in which the first and second transistors of the first differential pair are controlled in response to the high-frequency signal inputted from the high-frequency signal input section to adjust electric current passing through the second inductor of the first inductor pair and electric current passing through the fourth inductor of the second inductor pair, whereby mutual inductances of the first inductor pair and the second inductor pair are changed to thereby adjust peaking of signal waveform of electric current passing through the first inductor of the first inductor pair and peaking of signal waveform of electric current passing through the third inductor of the second inductor pair, thereby outputting the high-frequency signals subjected to the peaking adjustment from the high-frequency signal output section.

With the present invention, the compensation for the ill effects of the parasitic capacitance in the high-frequency range over 10 Gbps is made possible with less power consumption.

These features and advantages of the invention will be apparent from the following more particular description of preferred embodiments of the invention, as illustrated in the accompanying drawings.

DESCRIPTION OF THE PREFERRED EMBODIMENTS

Figure 1:
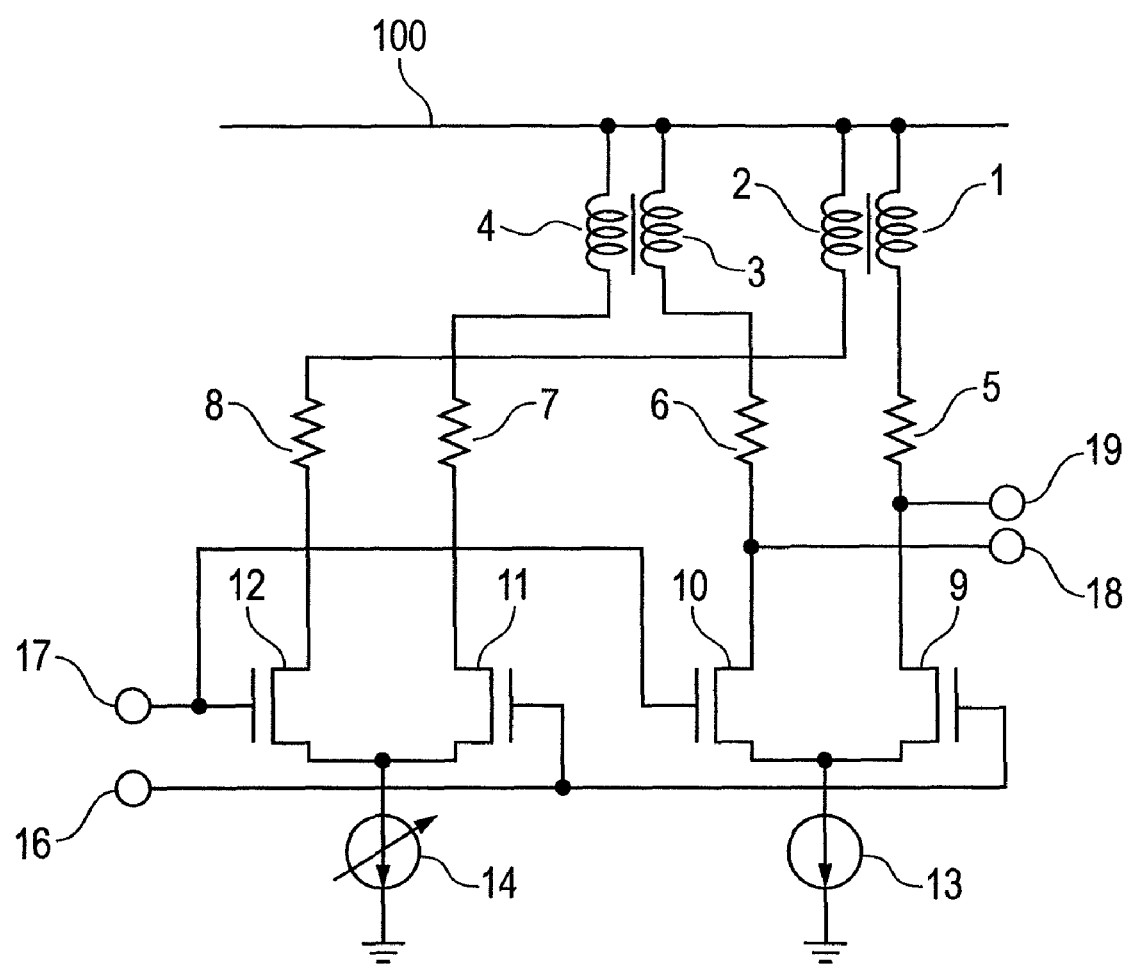
FIG. 1 is a circuitry diagram showing a variable peaking circuit in accordance with a first embodiment of the present invention.

In the present invention, a variable peaking circuit for adjusting the peaking of a high-frequency signal is implemented by using a pair of inductors electromagnetically coupled with each other (differently from conventional circuitry using transistors) and controlling the mutual inductance of the inductor pair, by which the ill effects of the parasitic capacitance in the high-frequency range can be compensated for with less power consumption.

Referring now to the drawings, a description will be given in detail of preferred embodiments in accordance with the present invention.

<Embodiment 1>

FIG. 1 shows an example of application of a variable peaking circuit in accordance with the present invention to a differential amplifier. In FIG. 1, the reference numerals "1"-"4" denote inductors, "5"-"8" denote resistors and "9"-"12" denote MOS transistors. Each inductor (1, 2, 3, 4) is connected to a power supply line 100 at one end, and to a corresponding resistor (5, 8, 6, 7) at the other end. The drains of the MOS transistors 9-12 are connected to the resistors 5-8, respectively. The reference numeral "13" denotes a current source and "14" denotes a variable current source. The current source 13 is connected to the sources of the transistors 9 and 10, while the variable current source 14 is connected to the sources of the transistors 11 and 12. The reference numerals "16" and "17" denote input terminals, while "18" and "19" denote output terminals. The inductors 1-4 are set so that their wire-winding directions are the same.

The inductors 1 and 2 are placed to be electromagnetically coupled with each other. Similarly, the inductors 3 and 4 are also placed to be electromagnetically coupled.

The transistors 9 and 10 form a first differential pair, while the transistors 11 and 12 form a second differential pair.

In this configuration (with a prescribed voltage applied between the input terminals 16 and 17), by adjusting the amount of electric current of the variable current source 14 for the second differential pair (which are connected to the aforementioned resistors 7 and 8, respectively), the amounts of electric currents passing through the inductors 2 and 4 (i.e., electric currents fed to the inductors 2 and 4 via the resistors 8 and 7, respectively) are controlled, and which is followed by changing of the mutual inductance of the inductors 1 and 2 and that of the inductors 3 and 4. By the changing of the mutual inductance of the inductors 1 and 2 and that of the inductors 3 and 4, the peaking levels of the signals outputted from the output terminals 18 and 19 (connecting to the transistors 10 and 9 of the first differential pair, respectively) can be adjusted.

Assuming that the self-inductance of the inductor 1 is L1 and the mutual inductance of the inductors 1 and 2 is M, the total inductance amounts to L1+M.

By changing the amount of the electric current of the variable current source 14, the electric current passing through the inductor 2 can be changed. In this case, the total inductance can be changed from L1 (when the current of the variable current source 14 is 0) to L1+Mmax (when the current of the variable current source 14 is at the maximum), by which the peaking level can be changed since the peaking level is proportional to the total inductance.

Figure 2:
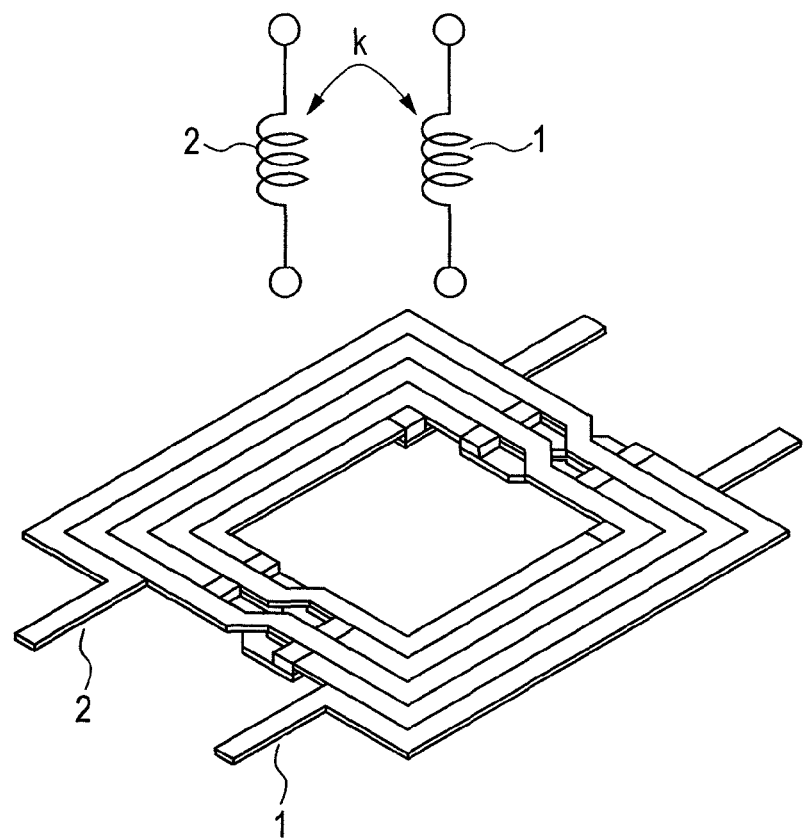
FIG. 2 is a perspective view showing an example of an electromagnetically coupled inductor pair formed by a thin film.

FIG. 2 shows an example of the configuration of the inductors 1 and 2 in a case where the inductors 1 and 2 are implemented by wiring on a semiconductor. In FIG. 2, the inductors 1 and 2 are formed to be electromagnetically coupled with each other. If this configuration is applied to a circuit like the one shown in FIG. 1, it is possible to control the inductance of the inductor 1 with the use of the mutual inductance between the inductors 1 and 2 by changing the electric current passing through the inductor 2.

Figure 3:
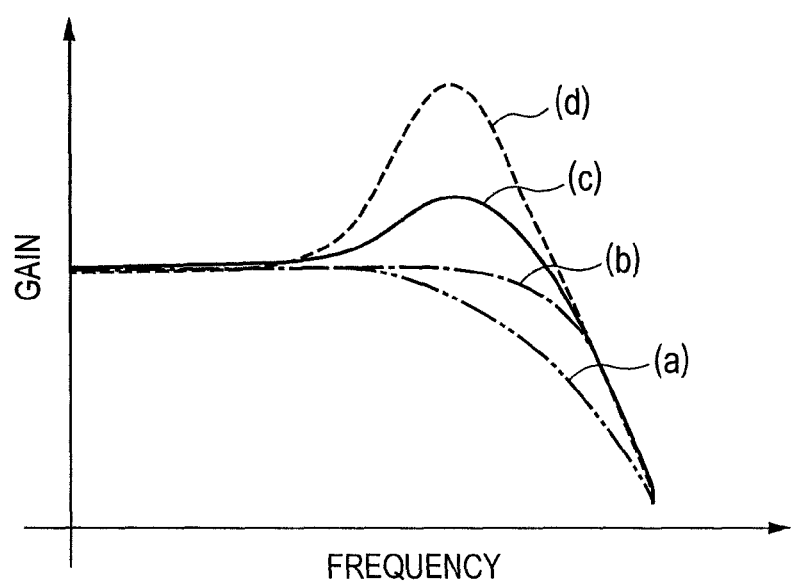
FIG. 3 is a graph showing frequency characteristics (relationship between gain and frequency) representing the effect of the peaking adjustment according to the first embodiment.

FIG. 3 shows examples of frequency characteristics (relationship between gain and frequency) achieved when the peaking is adjusted using the circuitry shown in FIG. 1. In FIG. 3, the letter (a) represents the frequency characteristic before the peaking adjustment (in which the gain in the high-frequency range is low). The letter (b) represents a state in which the flat part in the frequency characteristic curve has been extended by controlling the drain currents of the transistors 11 and 12 (second differential pair) using the variable current source 14 for peaking adjustment. The letter (c) represents a state in which the frequency characteristic (i.e., gain curve) in the high-frequency range has been raised relative to that in the low-frequency range by peaking adjustment. The letter (d) represents a state in which the frequency characteristic (gain curve) in the high-frequency range has been raised further by further peaking adjustment. As is clear from FIG. 3, when the drain currents of the transistors 11 and 12 (second differential pair) are controlled using the variable current source 14 shown in FIG. 1 for peaking adjustment, the original frequency characteristic (a), in which the gain drops significantly in the high-frequency range, can be improved ((b)-(d)).

Incidentally, the transistors 9-12 (MOS transistors in this example) may also be implemented by bipolar transistors instead.

<Modification 1>

Figure 4:
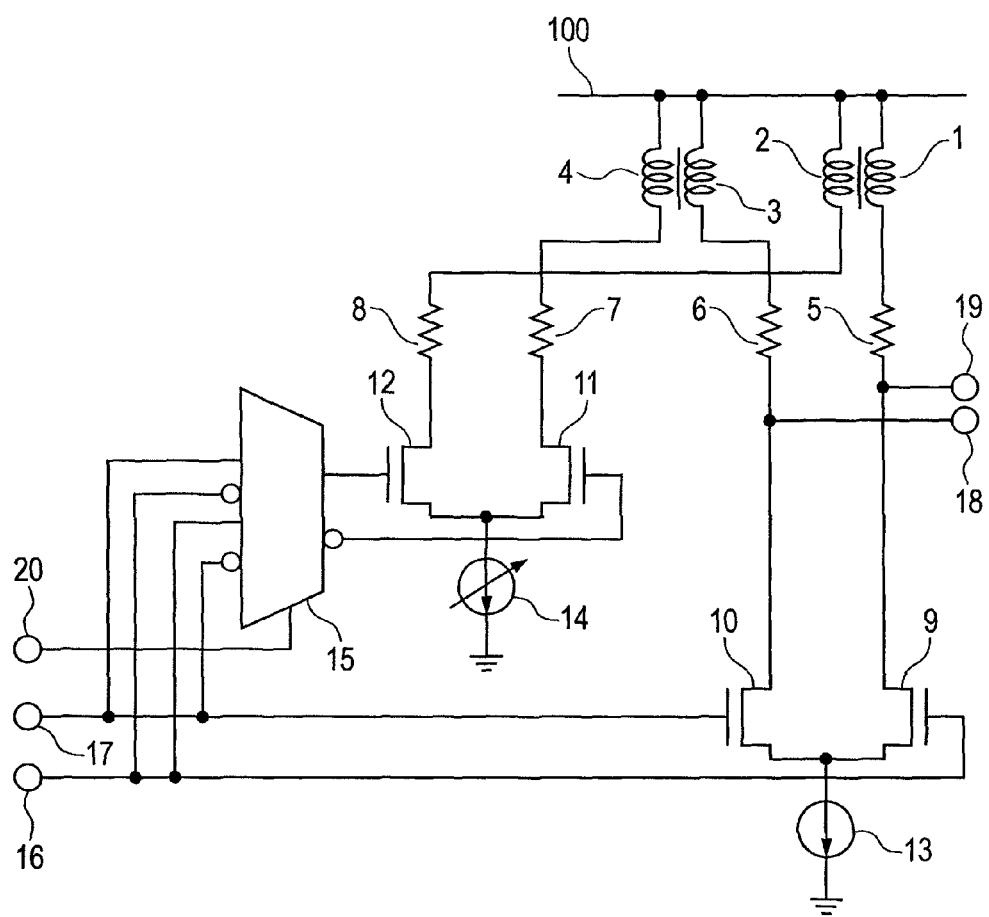
FIG. 4 is a circuitry diagram showing a variable peaking circuit in accordance with a first modification of the first embodiment.

FIG. 4 shows an example of modification of the circuitry of FIG. 1 to realize the switching of the input signals (using a selector 15) and extend the adjustable range of the coupling inductance, wherein components identical with those in FIG. 1 are assigned the same reference numerals as those in FIG. 1.

In the circuitry shown in FIG. 4, the selector 15 switches between inversion and noninversion of the input signals according to a control signal supplied via an input terminal 20 to switch polarities of gate voltages of the transistors 11 and 12. This makes it possible to switch polarities of the inductors 2 and 4, and the signs of the mutual inductances of the inductors 1 and 3 (electromagnetically coupled with the inductors 2 and 4, respectively) can be inverted, and consequently, the amount of peaking adjustment (adjustment range of the peaking level) can be enlarged.

Specifically, in the case of the inductor 1 (self-inductance: L1, mutual inductance with the inductor 2: M), the total inductance (in-phase) measured when the current passing through the inductor 2 is in phase with that passing through the inductor 1 equals L1−M. In contrast, the total inductance (differential) measured when the current passing through the inductor 2 is in inverted phase with that passing through the inductor 1 equals L1+M. Thus, the inductance can be changed between L1±M without the need of changing the wire-winding direction of the inductor 2.

With this modification, switching the polarity by the selector enables enlargement of the amount of the peaking adjustment based on the inductors.

<Modification 2>

Figure 5:
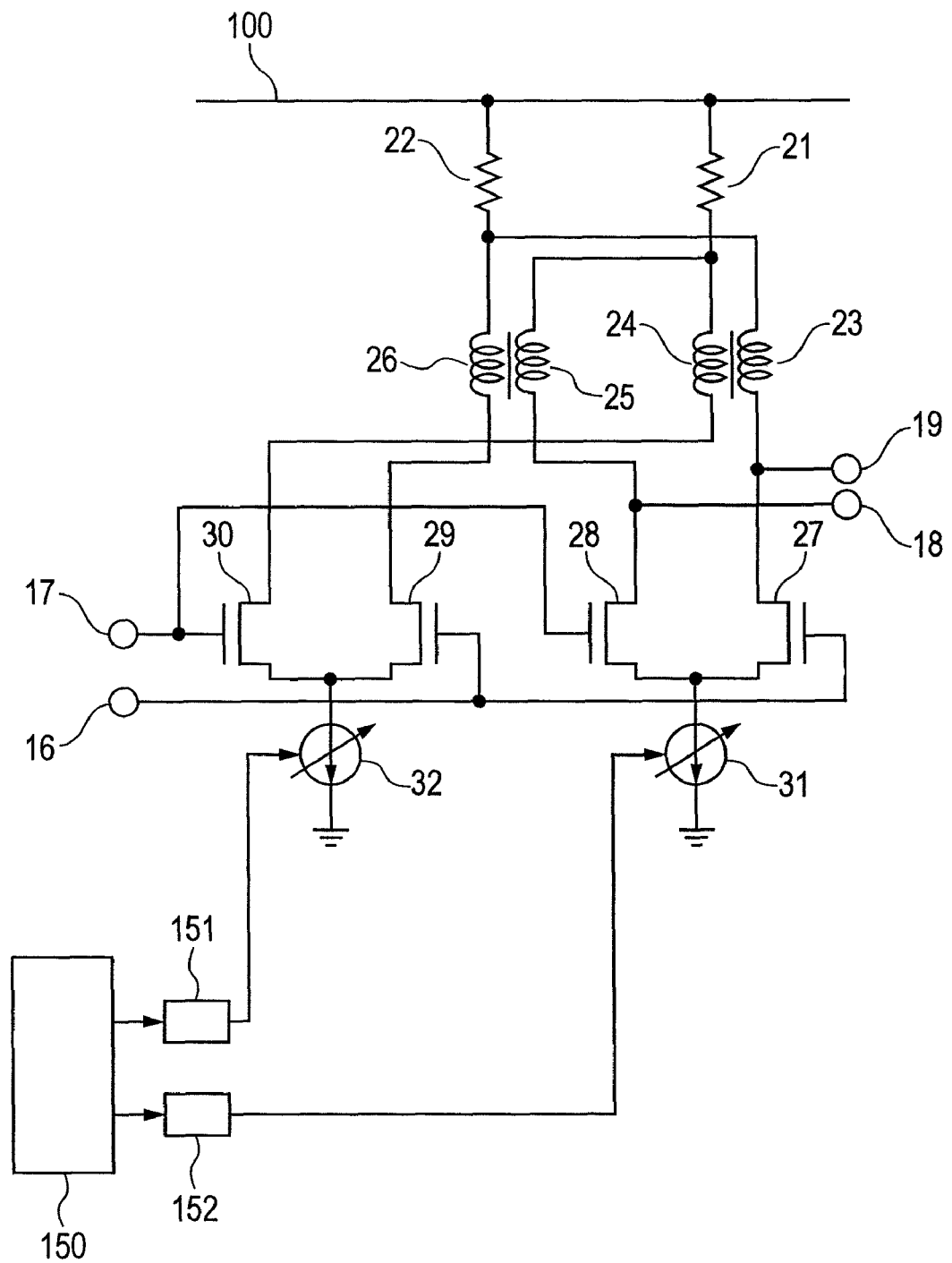
FIG. 5 is a circuitry diagram showing a variable peaking circuit in accordance with a second modification of the first embodiment.

FIG. 5 shows another example of modification of the circuitry of FIG. 1. In the example of FIG. 5, both of the current sources (31, 32) for supplying electric current to the first differential pair (formed by transistors 27 and 28) and the second differential pair (formed by transistors 29 and 30), respectively, are implemented by variable current sources.

In this configuration, the electric current of the current source 31 (for the first differential pair formed by the transistors 27 and 28) and that of the current source 32 (for the second differential pair formed by the transistors 29 and 30) are adjusted to change the mutual inductance of inductors 23 and 24 and that of inductors 25 and 26, thereby adjusting the peaking level. In this process, the current I1 of the current source 31 and the current I2 of the current source 32 are controlled by a control section 150 via digital-to-analog converters 151 and 152 so that the sum of the currents I1 and I2 remains constant. With the modified circuitry shown in FIG. 5, electric power consumption of the circuit can be reduced compared to the peaking level adjustment circuit of FIG. 1 since the whole electric current flows through a resistor 21 or 22 employed for current-voltage conversion without being wasted.

<Embodiment 2>

Figure 6:
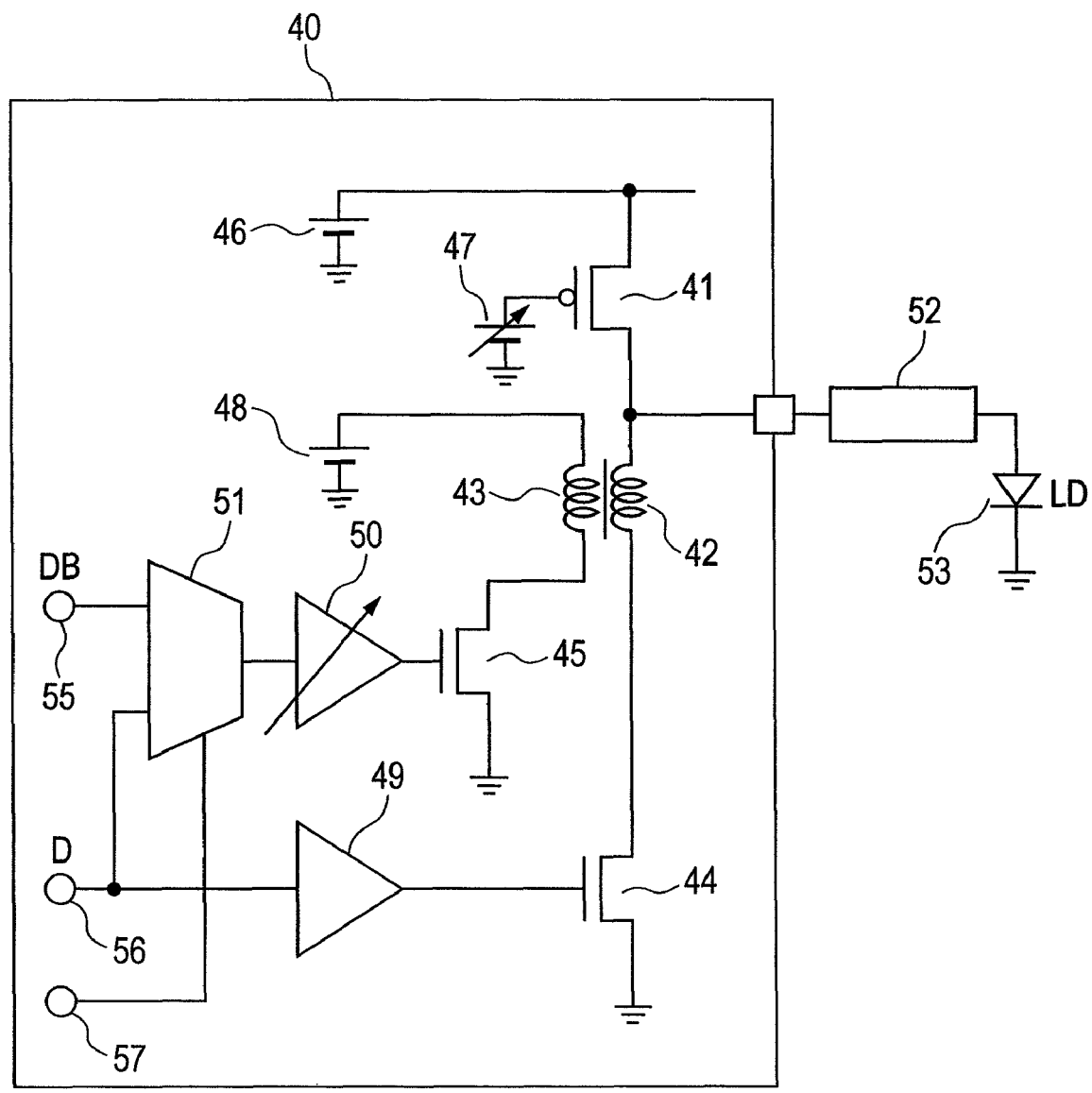
FIG. 6 is a circuitry diagram showing a variable peaking circuit in accordance with a second embodiment of the present invention.

FIG. 6 shows an example of application of a peaking adjustment circuit in accordance with the present invention to an LD (Laser Diode) driver circuit.

The reference numeral "40" in FIG. 6 denotes the LD driver circuit. The LD driver circuit 40 is connected to an LD (Laser Diode) 53 via a transmission line 52 which is implemented by printed-board wiring or wire bonding.

The LD driver circuit 40 includes a pair of inductors 42 and 43, transistors 41, 44 and 45, an amplifier 49, a variable amplifier 50, power sources 46 and 48, a variable power source 47, a selector 51, and signal terminals 55, 56 and 57.

The transistor 41 to which the power source 46 and the variable power source 47 are connected outputs bias current, while the transistor 44 whose gate is connected with the amplifier 49 outputs modulation current. The variable amplifier 50 is connected to the gate of the transistor 45 which is connected to the power source 48 via the inductor 43. The selector 51, which receives input signals via the signal terminals 55 and 56 and a control signal via the signal terminal 57, switches between in-phase and inverted-phase of the input signals according to the control signal.

In the LD driver circuit 40 configured as above, the transistor 41 supplies the bias current to the LD 53. The amount of the bias current is set by the variable power source 47 connected to the transistor 41.

Meanwhile, the signal inputted via the signal terminal 56 is amplified by the amplifier 49 and inputted to the gate of the transistor 44, by which the modulation current (modulated according to the signal inputted via the signal terminal 56) flows through the transistor 44.

In order to allow the LD 53 (supplied with the superposition (sum) of the bias current outputted by the transistor 41 and the modulation current outputted by the transistor 44) to operate satisfying desired light-emitting characteristics, it is necessary to adjust the peaking level of the modulation current which is controlled by the transistor 44 depending on the characteristics of the transmission line 52. As described above, the transmission line 52 is implemented by bonding wire or substrate wiring connecting the LD driver circuit 40 to the LD 53.

In this embodiment, the peaking level adjustment of the modulation current is implemented as below. The polarity of the voltage applied to the transistor 45 is switched by the selector 51, while the voltage applied to the transistor 45 is adjusted by the variable amplifier 50. Thus, the amount and direction of the current flowing through the transistor 45 are controlled. The thus-controlled current is made to flow through the inductor 43 and so the mutual inductance of the inductor 42 coupled with the inductor 43 is changed and adjusted, thereby enabling the current to be supplied to the LD 53 with an adjusted peaking level.

The switching of the polarity of the signal applied to the transistor 45 (using the selector 51) and the adjustment of the amplitude (using the variable amplifier 50) are implemented by switching the selector 51 and adjusting the volume control of the variable amplifier 50 while the light-emitting characteristics (output waveform) of the LD 53 are monitored so that the desired characteristics can be achieved.

Also in this embodiment (similarly to the explanation in the first embodiment), with a pair of inductors electromagnetically coupled with each other, the electric current passing through the other inductor is controlled and their mutual inductance is controlled, whereby the peaking of the signal waveform of the electric current passing through one inductor can be adjusted. Thus, the peaking adjustment becomes possible also for high-frequency signals over 10 Gbps, realizing stable optical transmission also in the high-frequency range.

Further, the in-phase/inverted-phase polarity switching of the input signals by the selector 51 enables expansion of the range of inductance adjustable by the electromagnetically coupled inductor pair, thereby making it possible to adjust peaking in a wider range.

<Modification 1>

Figure 7:
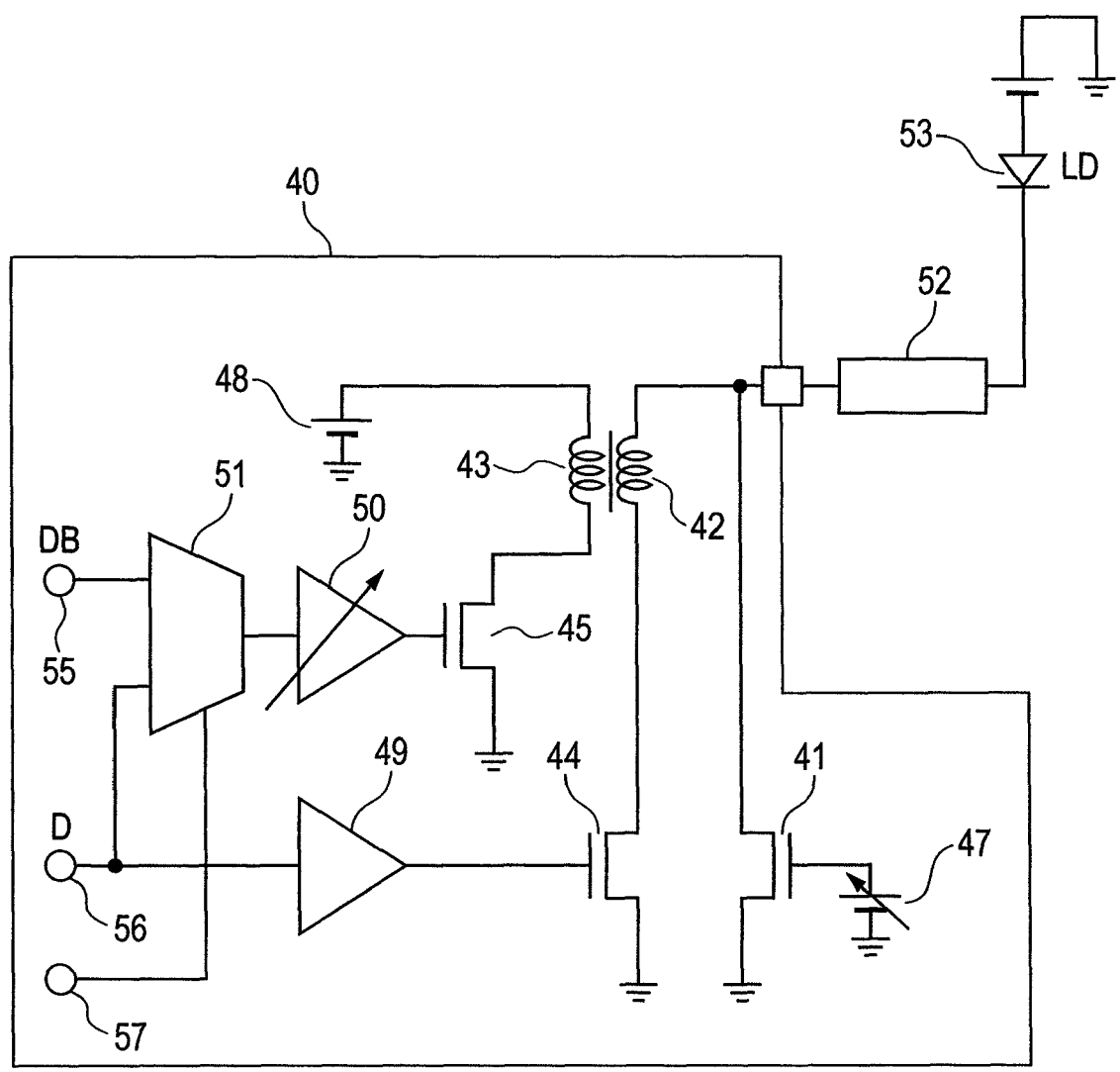
FIG. 7 is a circuitry diagram showing a variable peaking circuit in accordance with a first modification of the second embodiment.

FIG. 7 shows an example of modification of the circuitry of FIG. 6, wherein components identical with those in FIG. 6 are assigned the same reference numerals as those in FIG. 6. In this example, the electric current from the LD driver circuit 40 is fed to the cathode of the LD 53. By using the circuit shown in FIG. 7, the peaking adjustment becomes possible also in cases where electric current from an LD driver circuit is fed to the cathode of an LD.

<Embodiment 3>

Figure 8:
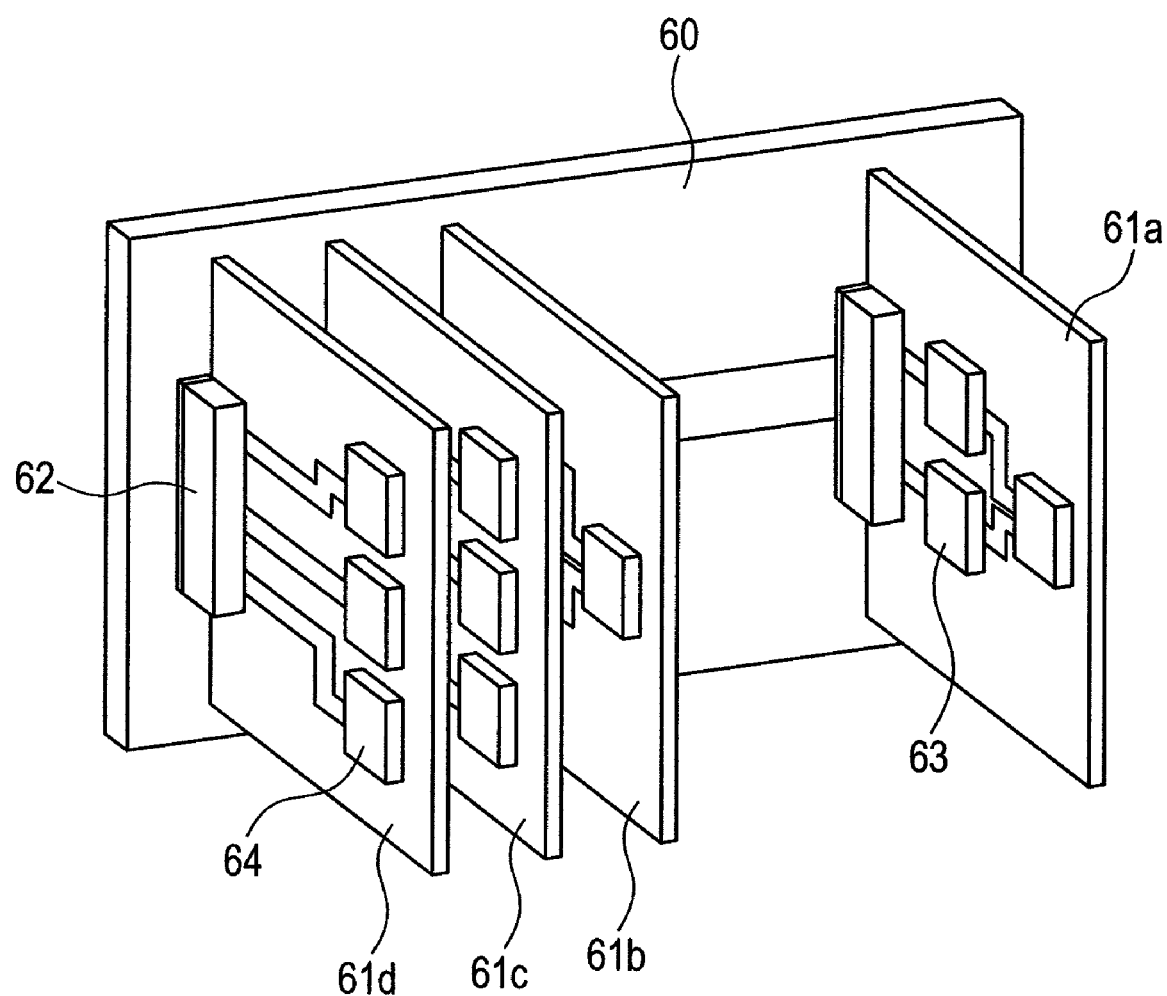
FIG. 8 is a perspective view showing the composition of a data-processing unit which is equipped with an element including a variable peaking circuit in accordance with a third embodiment of the present invention.

FIG. 8 shows an example of a data-processing unit employing the peaking adjustment circuit in accordance with the present invention. The data-processing unit includes a back plane 60, a plurality of daughter cards 61a, 61b, 61c and 61d which are connected to the back plane 60 via connectors 62, and LSIs 63 and 64 each of which is mounted on one of the daughter cards 61 and communicates information via the back plane 60.

Figure 9:
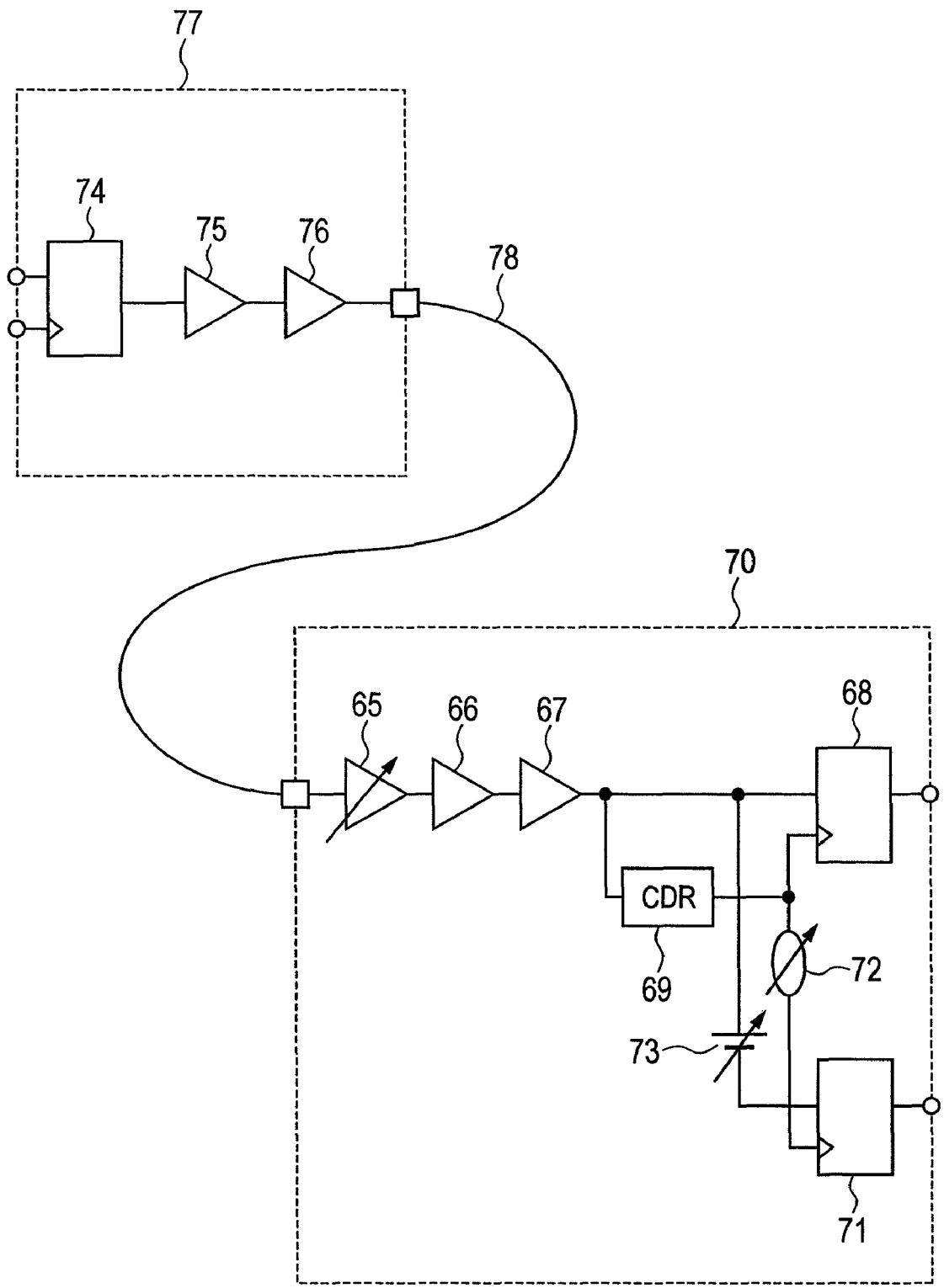
FIG. 9 is a block diagram of a circuit system in which the variable peaking circuit of the third embodiment has been installed.

Transmission lines on the back plane 60 and those on the daughter cards 61a-61d involve conductor loss and dielectric loss. Since the loss gets heavier in high-frequency components, the quality of the signal waveform is deteriorated, which causes data error when the loss becomes sizable. To address this problem, a transmission circuit 77 (see FIG. 9) mounted on each LSI (63, 64) includes a flip-flop circuit 74, a current amplification circuit 75 and a peaking output circuit 76 as shown in FIG. 9. The peaking output circuit 76 compensates for the loss occurring in the transmission lines 66 on the back plane 60 and the transmission lines 65 on the daughter cards 61a-61d. Thus the signal quality is improved.

Similarly, a reception circuit 70 mounted on each LSI (63, 64) includes a variable amplification circuit 65, a peaking circuit 66, a limit amplification circuit 67, a judgment circuit 68 and a CDR (Clock Data Recovery) circuit 69 as shown in FIG. 9. The peaking circuit 66 compensates for the loss occurring in the transmission lines 66 on the back plane 60 and the transmission lines 65 on the daughter cards 61a-61d. Thus the signal quality is improved.

The peaking output circuit 76 and the peaking circuit 66 may be configured like any one selected from FIG. 1, FIG. 4 and FIG. 5 explained in the first embodiment.

Since the lengths of the transmission lines on the back plane 60 and the daughter cards 61a-61d change and the loss occurring in the transmission lines changes depending on the positions of the daughter cards 61a-61d, the peaking circuit 66 is required to be able to change the difference between the gain (degree of amplification) in the low-frequency range and that in the high-frequency range (peaking level) according to the loss occurring in the transmission lines.

The peaking circuit 66 is configured by using a variable peaking circuit employing electromagnetically coupled inductors (like the one shown in FIG. 1, FIG. 4 or FIG. 5 explained in the first embodiment). Thus the peaking level can be adjusted also for high-frequency signals over 10 Gbps.

Incidentally, in cases where the peaking level is to be adjusted by the peaking circuit 66 on the reception circuit 70 side, it is desirable to adjust the peaking level such that the maximum phase/voltage margin is provided by use of a phase/voltage margin measurement circuit including a variable delay circuit 72, a variable voltage source 73 and a judgment circuit 71. The adjustment may also be performed for any one of phase and voltage.

While both the transmission circuit 77 and the reception circuit 70 are equipped with a variable peaking circuit in the example of FIG. 9, it is also possible to provide a variable peaking circuit only in the transmission circuit 77 or the reception circuit 70.

The invention may be embodied in other specific forms without departing from the spirit or essential characteristics thereof. The present embodiments are therefore to be considered in all respects as illustrative and not restrictive, the scope of the invention being indicated by the appended claims, rather than by the foregoing description, and all changes which come within the meaning and range of equivalency of the claims are therefore intended to be embraced therein.

The invention claimed is:

1. A peaking circuit for adjusting peaking of a high-frequency signal, comprising:
   a first inductor;
   a second inductor which is electromagnetically coupled with the first inductor;
   a signal input section which receives an input signal;
   a transistor which adjusts electric current passing through the second inductor, with the input signal in a predetermined high frequency range inputted via the signal input section, in accordance with an amount of electric current applied to the transistor from a variable current source; and
   a signal output section which outputs a signal whose peaking has been adjusted by the first inductor, wherein:
   mutual inductance of the electromagnetically coupled first and second inductors is changed by the adjustment of the electric current passing through the second inductor, according to the amount of electric current applied from the variable current source to the transistor, thereby adjusting the peaking of signal waveform of electric current passing through the first inductor to improve gain drops in the high-frequency range, and
   the signal subjected to the peaking adjustment is outputted from the signal output section.

2. The peaking circuit for adjusting peaking of a high-frequency signal, comprising:
   a first inductor;
   a second inductor which is electromagnetically coupled with the first inductor;
   a signal input section which receives an input signal;
   a transistor which adjusts electric current passing through the second inductor according to the input signal inputted via the signal input section; and
   a signal output section which outputs a signal whose peaking has been adjusted by the first inductor, wherein:
   mutual inductance of the electromagnetically coupled first and second inductors is changed by the adjustment of the electric current passing through the second inductor, according to the input signal inputted via the signal input section, with the use of the transistor, thereby adjusting the peaking of signal waveform of electric current passing through the first inductor,
   the signal subjected to the peaking adjustment is outputted from the signal output section, further comprising:
   a modulated signal generating section which generates a modulated signal modulated according to the input signal inputted via the signal input section; and
   a bias current generating section which generates bias current,
   wherein, mutual inductance of the electromagnetically coupled first and second inductors is changed by the adjustment of the electric current passing through the second inductor with the use of the transistor, thereby adjusting with the use of the first inductor the peaking of signal waveform of the modulated signal generated by the modulated signal generating section, and
   the signal output section outputs a signal obtained by superposing the modulated signal subjected to the peaking adjustment by the coupled first and second inductors on the bias current generated by the bias current generating section.

3. A laser diode driving circuit for driving a laser diode, comprising the peaking circuit according to claim 2.

4. A differential amplifier comprising:
a first inductor pair formed by first and second inductors placed to be electromagnetically coupled with each other;
a second inductor pair formed by third and fourth inductors placed to be electromagnetically coupled with each other;
a first differential pair formed by first and second transistors whose sources are connected to each other;
a second differential pair formed by third and fourth transistors whose sources are connected to each other;
a high-frequency signal input section which inputs a high-frequency signal to the first differential pair and the second differential pair;
a peaking adjustment circuit which adjusts peaking of signal waveform of electric current passing through the first inductor of the first inductor pair and peaking of signal waveform of electric current passing through the third inductor of the second inductor pair; and
a high-frequency signal output section which outputs peaking adjusted high-frequency signals from the first inductor pair and the second inductor pair, respectively.

5. The differential amplifier according to claim 4, wherein the peaking adjustment circuit, the peaking of signal waveform of electric current passing through the first inductor of the first inductor pair and the peaking of signal waveform of electric current passing through the third inductor of the second inductor pair are adjusted by controlling the first and second transistors of the first differential pair in response to the high-frequency signal inputted from the high-frequency signal input section to adjust electric current passing through the second inductor of the first inductor pair and electric current passing through the fourth inductor of the second inductor pair, whereby mutual inductances of the first inductor pair and the second inductor pair are changed and the peaking of signal waveform of electric current passing through the first inductor of the first inductor pair and the peaking of signal waveform of electric current passing through the third inductor of the second inductor pair are adjusted.

6. The differential amplifier according to claim 4, further comprising a selector which switches polarity of the high-frequency signal inputted from the high-frequency signal input section and inputted to the first differential pair.

7. The differential amplifier according to claim 4, further comprising:
a first variable current source connected to the sources of the first and second transistors of the first differential pair;
a second variable current source connected to the sources of the third and fourth transistors of the second differential pair; and
a control section which controls the first and second variable current sources,
wherein the control section controls the first and second variable current sources so that the sum of electric current passing through the first variable current source and electric current passing through the second variable current source remains constant.

8. A data-processing unit comprising:
a transmission circuit for transmitting a high-frequency signal; and
a reception circuit for receiving a high-frequency signal,
wherein at least either the transmission circuit or the reception circuit includes the peaking adjustment circuit described in claim 4.

9. A method for adjusting peaking of a high-frequency signal within a predetermined high frequency range outputted from a circuit, comprising the steps of:
adjusting electric current passing through a first inductor included in an electromagnetically coupled inductor pair formed by the first inductor and a second inductor with the use of a transistor with a high-frequency signal within said high frequency range inputted to the circuit, in accordance with an amount of electric current applied to the transistor from a variable current source, thereby changing mutual inductance of the second inductor; and
adjusting peaking of a signal outputted from a signal line connecting with the second inductor whose mutual inductance has been changed to improve gain drops in the high-frequency range.

10. The peaking adjustment method of a high-frequency signal outputted from a circuit, comprising the steps of:
adjusting electric current passing through a first inductor included in an electromagnetically coupled inductor pair formed by the first inductor and a second inductor with the use of a transistor according to a high-frequency signal inputted to the circuit, thereby changing mutual inductance of the second inductor; and
adjusting peaking of a signal outputted from a signal line connecting with the second inductor whose mutual inductance has been changed, further comprising the steps of:
generating a modulated signal modulated according to the inputted high-frequency signal;
generating a bias current using a bias current generating section;
controlling the electric current passing through the first inductor with the use of the transistor and changing the mutual inductance of the second inductor electromagnetically coupled with the first inductor, thereby executing peaking adjustment for the modulated signal; and
outputting a signal obtained by superposing the modulated signal subjected to the peaking adjustment on the bias current.

11. The peaking adjustment method according to claim 10, wherein a laser diode is driven by the output of the signal obtained by superposing the modulated signal subjected to the peaking adjustment on the bias current.

12. A method for adjusting peaking of a high-frequency signal of a differential amplifier, said differential amplifier comprising:
a first inductor pair formed by first and second inductors placed to be electromagnetically coupled with each other;
a second inductor pair formed by third and fourth inductors placed to be electromagnetically coupled with each other;
a first differential pair formed by first and second transistors whose sources are connected to each other;
a second differential pair formed by third and fourth transistors whose sources are connected to each other;
a high-frequency signal input section which inputs a high-frequency signal to the first differential pair and the second differential pair; and a high-frequency signal output section which outputs high-frequency signals from the first inductor pair and the second inductor pair, respectively;

said method comprising the steps of:

controlling the first and second transistors of the first differential pair in response to the high-frequency signal inputted from the high-frequency signal input section to adjust electric current passing through the second inductor of the first inductor pair and electric current passing through the fourth inductor of the second inductor pair, whereby mutual inductances of the first inductor pair and the second inductor pair are changed to thereby adjust peaking of signal waveform of electric current passing through the first inductor of the first inductor pair and peaking of signal waveform of electric current passing through the third inductor of the second inductor pair; and outputting the high-frequency signals subjected to the peaking adjustment from the high-frequency signal output section.

13. The peaking adjustment method according to claim 12, wherein the high-frequency signal is inputted to the first differential pair after a selector has switched polarity of the high-frequency signal.

14. The peaking adjustment method according to claim 12, wherein electric current fed to the connected sources of the first and second transistors of the first differential pair and electric current fed to the connected sources of the third and fourth transistors of the second differential pair are controlled so that the sum of the electric currents remains constant.

* * * * *